United States Patent
Ku et al.

(10) Patent No.: US 7,422,637 B2
(45) Date of Patent: Sep. 9, 2008

(54) PROCESSING CHAMBER CONFIGURED FOR UNIFORM GAS FLOW

(75) Inventors: Vincent Ku, San Jose, CA (US); Ling Chen, Sunnyvale, CA (US); Howard Grunes, Santa Cruz, CA (US); Hua Chung, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 8 days.

(21) Appl. No.: 11/552,727

(22) Filed: Oct. 25, 2006

(65) Prior Publication Data

US 2007/0044719 A1 Mar. 1, 2007

Related U.S. Application Data

(63) Continuation of application No. 10/268,438, filed on Oct. 9, 2002, now abandoned.

(51) Int. Cl.
*C23C 16/00* (2006.01)
*C23F 1/00* (2006.01)
*H01L 21/306* (2006.01)

(52) U.S. Cl. .................. 118/728; 118/729; 118/730; 156/345.51; 156/345.52; 156/345.53; 156/345.54; 156/345.55

(58) Field of Classification Search .............. 118/728; 156/345.51
See application file for complete search history.

(56) References Cited

U.S. PATENT DOCUMENTS

| | | | |
|---|---|---|---|
| 4,058,430 A | 11/1977 | Suntola et al. | |
| 4,389,973 A | 6/1983 | Suntola et al. | |
| 4,413,022 A | 11/1983 | Suntola et al. | |
| 4,415,275 A | 11/1983 | Dietrich | |
| 4,761,269 A | 8/1988 | Conger et al. | |
| 4,834,831 A | 5/1989 | Nishizawa et al. | |
| 4,886,565 A * | 12/1989 | Koshiba et al. | 156/345.46 |
| 4,975,252 A | 12/1990 | Nishizawa et al. | |
| 4,993,357 A | 2/1991 | Scholz | |
| 5,027,746 A | 7/1991 | Frijlink et al. | |
| 5,133,986 A | 7/1992 | Blum et al. | |
| 5,225,366 A | 7/1993 | Yoder | |

(Continued)

FOREIGN PATENT DOCUMENTS

EP 0497267 8/1992

(Continued)

*Primary Examiner*—Parviz Hassanzadeh
*Assistant Examiner*—Rakesh K Dhingra
(74) *Attorney, Agent, or Firm*—Patterson & Sheridan, LLP

(57) ABSTRACT

An apparatus and method for performing uniform gas flow in a processing chamber is provided. In one embodiment, an apparatus is an edge ring that includes an annular body having an annular seal projecting therefrom is provided. The seal is coupled to a side of the annular body opposite a side adapted to seat on the substrate support. In another embodiment, a processing system is provided that includes a chamber body, a lid, a substrate support and a plurality of flow control orifices. The lid is disposed on the chamber body and defining an interior volume therewith. The substrate support is disposed in the interior volume and at least partially defines a processing region with the lid. The flow control orifices are disposed between the substrate support and the lid. The flow control orifices are adapted to control flow of gases exiting the processing region.

19 Claims, 7 Drawing Sheets

U.S. PATENT DOCUMENTS

| | | |
|---|---|---|
| 5,261,959 A | 11/1993 | Gasworth |
| 5,281,274 A | 1/1994 | Yoder |
| 5,294,286 A | 3/1994 | Nishizawa et al. |
| 5,338,362 A | 8/1994 | Imahashi |
| 5,374,570 A | 12/1994 | Nasu et al. |
| 5,441,703 A | 8/1995 | Jurgensen |
| 5,443,647 A | 8/1995 | Aucoin et al. |
| 5,480,818 A | 1/1996 | Matsumoto et al. |
| 5,483,919 A | 1/1996 | Yokoyama et al. |
| 5,503,875 A | 4/1996 | Imai et al. |
| 5,558,717 A | 9/1996 | Zhao et al. |
| 5,571,577 A | 11/1996 | Zhang et al. |
| 5,578,167 A * | 11/1996 | Sooriakumar et al. ........ 438/745 |
| 5,674,786 A | 10/1997 | Turner et al. |
| 5,688,359 A | 11/1997 | Martin |
| 5,711,811 A | 1/1998 | Suntola et al. |
| 5,730,802 A | 3/1998 | Ishizumi et al. |
| 5,796,116 A | 8/1998 | Nakata et al. |
| 5,805,408 A * | 9/1998 | Maraschin et al. .......... 361/234 |
| 5,807,792 A | 9/1998 | Ilg et al. |
| 5,835,677 A | 11/1998 | Li et al. |
| 5,855,680 A | 1/1999 | Soininen et al. |
| 5,879,459 A | 3/1999 | Gadgil et al. |
| 5,916,365 A | 6/1999 | Sherman |
| 6,015,590 A | 1/2000 | Suntola et al. |
| 6,042,652 A | 3/2000 | Hyun et al. |
| 6,071,572 A | 6/2000 | Mosely et al. |
| 6,139,700 A | 10/2000 | Kang et al. |
| 6,159,299 A | 12/2000 | Koai et al. |
| 6,174,377 B1 | 1/2001 | Doering et al. |
| 6,183,563 B1 | 2/2001 | Choi et al. |
| 6,197,683 B1 | 3/2001 | Kang et al. |
| 6,200,893 B1 | 3/2001 | Sneh |
| 6,231,672 B1 | 5/2001 | Choi et al. |
| 6,270,572 B1 | 8/2001 | Kim et al. |
| 6,302,965 B1 | 10/2001 | Umotoy et al. |
| 6,305,314 B1 | 10/2001 | Sneh et al. |
| 6,306,216 B1 | 10/2001 | Kim et al. |
| 6,447,607 B2 | 9/2002 | Soininen et al. |
| 6,478,872 B1 | 11/2002 | Chae et al. |
| 6,481,945 B1 | 11/2002 | Hasper et al. |
| 6,506,291 B2 | 1/2003 | Tsai et al. |
| 6,511,539 B1 | 1/2003 | Raaijmakers |
| 6,551,406 B2 | 4/2003 | Kilpi |
| 6,572,705 B1 | 6/2003 | Suntola et al. |
| 6,578,287 B2 | 6/2003 | Aswad |
| 6,579,372 B2 | 6/2003 | Park |
| 6,590,186 B2 | 7/2003 | Tanaka et al. |
| 6,593,484 B2 | 7/2003 | Yasuhara et al. |
| 6,630,030 B1 | 10/2003 | Suntola et al. |
| 6,630,201 B2 | 10/2003 | Chiang et al. |
| 6,660,126 B2 | 12/2003 | Nguyen et al. |
| 6,716,287 B1 | 4/2004 | Santiago et al. |
| 6,718,126 B2 | 4/2004 | Lei |
| 6,734,020 B2 | 5/2004 | Lu et al. |
| 6,772,072 B2 | 8/2004 | Ganguli et al. |
| 6,773,507 B2 | 8/2004 | Jallepally et al. |
| 6,777,352 B2 | 8/2004 | Tepman et al. |
| 6,778,762 B1 | 8/2004 | Shareef et al. |
| 6,815,285 B2 | 11/2004 | Choi et al. |
| 6,818,094 B2 | 11/2004 | Yudovsky |
| 6,821,563 B2 | 11/2004 | Yudovsky |
| 6,846,380 B2 | 1/2005 | Dickinson et al. |
| 6,866,746 B2 | 3/2005 | Lei et al. |
| 6,868,859 B2 | 3/2005 | Yudovsky |
| 6,908,540 B2 | 6/2005 | Kholodenko |
| 2001/0000866 A1 | 5/2001 | Sneh et al. |
| 2001/0009140 A1 | 7/2001 | Bondestam et al. |
| 2001/0011526 A1 | 8/2001 | Doering et al. |
| 2001/0013312 A1 | 8/2001 | Soininen et al. |
| 2001/0014371 A1 | 8/2001 | Kilpi |
| 2001/0014526 A1 | 8/2001 | Clenvenger et al. |
| 2001/0042523 A1 | 11/2001 | Kesala |
| 2001/0042799 A1 | 11/2001 | Kim et al. |
| 2001/0054377 A1 | 12/2001 | Lindfors et al. |
| 2002/0000196 A1 | 1/2002 | Park |
| 2002/0007790 A1 | 1/2002 | Park |
| 2002/0009544 A1 | 1/2002 | McFeely et al. |
| 2002/0017242 A1 | 2/2002 | Hamaguchi et al. |
| 2002/0041931 A1 | 4/2002 | Suntola et al. |
| 2002/0052097 A1 | 5/2002 | Park |
| 2002/0066411 A1 | 6/2002 | Chiang et al. |
| 2002/0073924 A1 | 6/2002 | Chiang et al. |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0086106 A1 | 7/2002 | Park et al. |
| 2002/0092471 A1 | 7/2002 | Kang et al. |
| 2002/0094689 A1 | 7/2002 | Park |
| 2002/0104481 A1 | 8/2002 | Chiang et al. |
| 2002/0108570 A1 | 8/2002 | Lindfors et al. |
| 2002/0115886 A1 | 8/2002 | Yasuhara et al. |
| 2002/0121241 A1 | 9/2002 | Nguyen et al. |
| 2002/0121342 A1 | 9/2002 | Lu et al. |
| 2002/0127745 A1 | 9/2002 | Lu et al. |
| 2002/0134307 A1 | 9/2002 | Choi |
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2003/0004723 A1 | 1/2003 | Chihara |
| 2003/0010451 A1 | 1/2003 | Tzu et al. |
| 2003/0017697 A1 | 1/2003 | Choi et al. |
| 2003/0022338 A1 | 1/2003 | Ruben et al. |
| 2003/0042630 A1 | 3/2003 | Babcoke et al. |
| 2003/0053799 A1 | 3/2003 | Lei et al. |
| 2003/0057527 A1 | 3/2003 | Chung et al. |
| 2003/0072913 A1 | 4/2003 | Chou et al. |
| 2003/0075273 A1 | 4/2003 | Kilpela et al. |
| 2003/0075925 A1 | 4/2003 | Lindfors et al. |
| 2003/0079686 A1 | 5/2003 | Chen et al. |
| 2003/0089308 A1 | 5/2003 | Raaijmakers |
| 2003/0101927 A1 | 6/2003 | Raaijmakers |
| 2003/0101938 A1 | 6/2003 | Ronsse et al. |
| 2003/0106490 A1 | 6/2003 | Jallepally et al. |
| 2003/0113187 A1 | 6/2003 | Lei et al. |
| 2003/0116087 A1 | 6/2003 | Nguyen et al. |
| 2003/0121469 A1 | 7/2003 | Lindfors et al. |
| 2003/0121608 A1 | 7/2003 | Chen et al. |
| 2003/0140854 A1 | 7/2003 | Kilpi |
| 2003/0143328 A1 | 7/2003 | Chen et al. |
| 2003/0143747 A1 | 7/2003 | Bondestam et al. |
| 2003/0153177 A1 | 8/2003 | Tepman et al. |
| 2003/0172872 A1 | 9/2003 | Thakur et al. |
| 2003/0194493 A1 | 10/2003 | Chang et al. |
| 2003/0198754 A1 | 10/2003 | Xi et al. |
| 2003/0213560 A1 | 11/2003 | Wang et al. |
| 2003/0216981 A1 | 11/2003 | Tillman |
| 2003/0219942 A1 | 11/2003 | Choi et al. |
| 2003/0221780 A1 | 12/2003 | Lei et al. |
| 2003/0224107 A1 | 12/2003 | Lindfors et al. |
| 2003/0235961 A1 | 12/2003 | Metzner et al. |
| 2004/0005749 A1 | 1/2004 | Choi et al. |
| 2004/0011404 A1 | 1/2004 | Ku et al. |
| 2004/0011504 A1 | 1/2004 | Ku et al. |
| 2004/0013577 A1 | 1/2004 | Ganguli et al. |
| 2004/0014320 A1 | 1/2004 | Chen et al. |
| 2004/0015300 A1 | 1/2004 | Ganguli et al. |
| 2004/0016404 A1 | 1/2004 | Gregg et al. |
| 2004/0025370 A1 | 2/2004 | Guenther et al. |
| 2004/0065255 A1 | 4/2004 | Yang et al. |
| 2004/0069227 A1 | 4/2004 | Ku et al. |
| 2004/0071897 A1 | 4/2004 | Verplancken et al. |
| 2004/0144308 A1 | 7/2004 | Yudovsky |
| 2004/0144311 A1 | 7/2004 | Chen et al. |

| | | | | | | |
|---|---|---|---|---|---|---|
| 2004/0219784 | A1 | 11/2004 | Kang et al. | JP | 05-270997 | 10/1993 |
| 2004/0224506 | A1 | 11/2004 | Choi et al. | JP | 06-224138 | 8/1994 |
| 2004/0235285 | A1 | 11/2004 | Kang et al. | JP | 2000212752 | 8/2000 |
| 2005/0006799 | A1 | 1/2005 | Gregg et al. | JP | 2000319772 | 11/2000 |
| 2005/0059240 | A1 | 3/2005 | Choi et al. | JP | 2001020075 | 1/2001 |
| 2005/0095859 | A1 | 5/2005 | Chen et al. | WO | WO 96/17107 | 6/1996 |
| 2005/0104142 | A1 | 5/2005 | Narayanan et al. | WO | WO 99/01595 | 1/1999 |

FOREIGN PATENT DOCUMENTS

| | | |
|---|---|---|
| EP | 1 167 569 | 1/2002 |
| JP | 58-098917 | 6/1983 |
| JP | 62-027571 | 2/1987 |
| JP | 04-291916 | 10/1992 |
| JP | 05-047666 | 2/1993 |
| JP | 05-206036 | 8/1993 |
| JP | 05-234899 | 9/1993 |

| | | |
|---|---|---|
| WO | WO 99/65064 | 12/1999 |
| WO | WO 00/54320 | 9/2000 |
| WO | WO 00/79576 | 12/2000 |
| WO | WO 01/17692 | 3/2001 |
| WO | WO 01/36702 | 5/2001 |
| WO | WO 02/08488 | 1/2002 |
| WO | WO 02/45871 | 6/2002 |
| WO | WO 03/023835 | 3/2003 |

\* cited by examiner

ND STATES PATENT

US 7,422,637 B2

PROCESSING CHAMBER CONFIGURED FOR UNIFORM GAS FLOW

CROSS-REFERENCE TO RELATED APPLICATIONS

This application is a continuation of U.S. patent application Ser. No. 10/268,438, filed Oct. 9, 2002 now abandoned, which published on Apr. 15, 2004 as United States Patent Publication No. 2004/0069227, which is incorporated herein by reference in its entirety.

BACKGROUND OF THE INVENTION

1. Field of the Invention

Embodiments of the present invention generally relate to an improved gas delivery apparatus for semiconductor processing.

2. Description of the Related Art

Reliably producing sub-micron and smaller features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of vias, contacts, and other features, as well as the dielectric materials between them, decrease to sub-micron dimensions (e.g., less than 0.20 micrometers or less), whereas the thickness of the dielectric layers remains substantially constant, with the result that the aspect ratios for the features, i.e., their height divided by width, increase. Many traditional deposition processes have difficulty filling sub-micron structures where the aspect ratio exceeds 4:1, and particularly where the aspect ratio exceeds 10:1. Therefore, there is a great amount of ongoing effort being directed at the formation of substantially void-free and seam-free sub-micron features having high aspect ratios.

Atomic layer deposition is one deposition technique being explored for the deposition of material layers over features having high aspect ratios. One example of atomic layer deposition comprises the sequential introduction of pulses of gases. For instance, one cycle for the sequential introduction of pulses of gases may comprise a pulse of a first reactant gas, followed by a pulse of a purge gas and/or a pump evacuation, followed by a pulse of a second reactant gas, and followed by a pulse of a purge gas and/or a pump evacuation. The term "gas" as used herein is defined to include a single gas or a plurality of gases. Sequential introduction of separate pulses of the first reactant and the second reactant may result in the alternating self-limiting absorption of monolayers of the reactants on the surface of the substrate and, thus, forms a monolayer of material for each cycle. The cycle may be repeated to a desired thickness of the deposited material. A pulse of a purge gas and/or a pump evacuation between the pulses of the first reactant gas and the pulses of the second reactant gas serves to reduce the likelihood of gas phase reactions of the reactants due to excess amounts of the reactants remaining in the chamber.

As a single monolayer of material is deposited in each cycle, the ability to rapidly deliver and remove reactant and purge gases from the chamber has a substantial effect on substrate throughput. While using smaller volumes of gases reduces cycle times, flow uniformity becomes increasingly important in order to ensure complete and uniform substrate coverage during processing.

Therefore, there is a need for methods and processing apparatuses that improve flow uniformity within processing chambers to enhance uniform substrate processing.

SUMMARY OF THE INVENTION

Embodiments of the present invention relate to an apparatus and method for providing uniform gas flow in a processing chamber. In one aspect of the invention, an edge ring for a substrate support pedestal is provided that includes an annular body having an annular seal projecting therefrom. The seal is coupled to a side of the annular body opposite a side adapted to seat on the substrate support.

In another aspect of the invention, a processing system is provided that includes a chamber body, a lid, a substrate support and a plurality of flow control orifices. The lid is disposed on the chamber body and defines an interior volume therewith. The substrate support is disposed in the interior volume and at least partially defines a processing region with the lid. The flow control orifices are disposed between the substrate support and the lid. The flow control orifices are adapted to control flow of gases exiting the processing region.

In another aspect of the invention, a method of flowing gases through a processing chamber is provided. In one embodiment, the method of flowing gases through a processing chamber includes the steps of flowing a process gas into a processing region defined between a substrate support and a lid of the chamber body, flowing gas from the processing region to a pumping region of the chamber body through a plurality of flow control orifices defined at a perimeter of the substrate support, and flowing process gas through an exhaust port formed in at least one of the chamber body or the lid.

In another embodiment, an edge ring for a substrate support is described. The edge ring includes an annular body having an inner diameter and an outer diameter defining a top surface on a first side thereof, wherein the outer diameter comprises a flange extending below the top surface, a second side opposing the top surface, the second side adapted to at least partially seat on the substrate support, and a seal retaining member having a first member projecting above the top surface and a second member extending radially inward of the first member to define a seal receiving pocket.

In another embodiment, an edge ring for a substrate support is described. The edge ring includes an annular body having an inner diameter and an outer diameter defining a top surface on a first side thereof a second side opposing the top surface, the second side adapted to seat on the substrate support, and an annular seal disposed in a seal retaining member, the seal retaining member and the seal extending above the top surface of the annular body.

In another embodiment, a processing system is described. The system includes a chamber body, a lid disposed on the chamber body and defining an interior volume therewith, a substrate support disposed in the interior volume and at least partially defining a processing region with the lid. The lid also includes an edge ring which includes an annular body having an inner diameter and an outer diameter defining a top surface on a first side thereof, wherein the outer diameter comprises a flange extending below the top surface, a second side opposing the top surface, the second side adapted to at least partially seat on the substrate support, and a seal retaining member, and the system further comprises a plurality of flow control orifices disposed between the substrate support and the lid, the flow control orifices adapted to control flow of gases exiting the processing region.

BRIEF DESCRIPTION OF THE DRAWINGS

So that the manner in which the above recited features of the present invention are attained and can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

Figure 1:
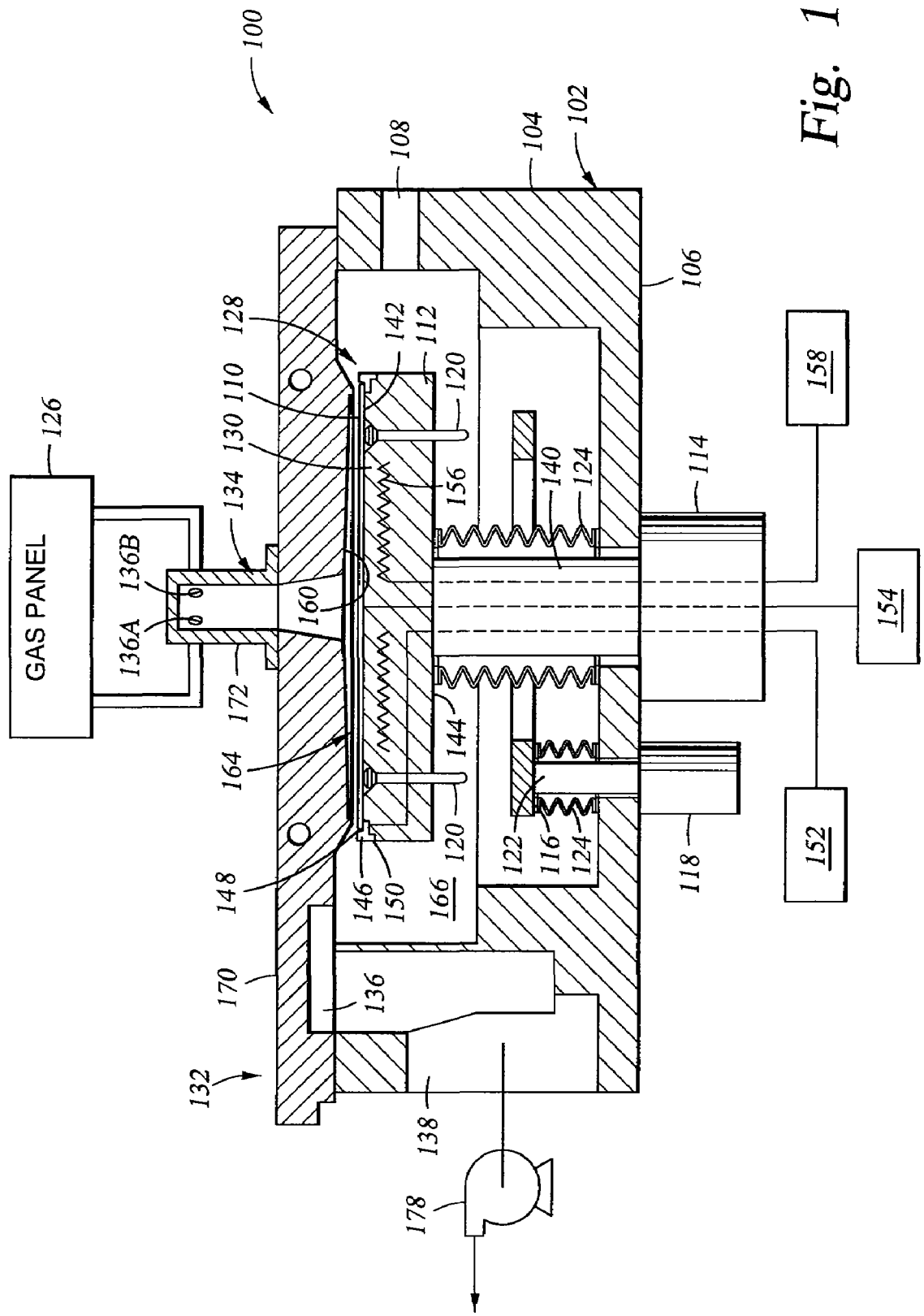
FIG. 1 is a schematic cross-sectional view of one embodiment of a processing chamber having a plurality of flow control orifices.

FIG. 1 is a schematic cross-sectional view of one embodiment of a processing chamber 100 adapted for atomic layer deposition having uniform gas flow across the diameter of a substrate 110 processed therein. The term "atomic layer deposition" as used herein refers to a chemical vapor deposition process having sequential introduction of reactants to deposit a thin layer over a substrate structure. The sequential introduction of reactants may be repeated to deposit a plurality of thin layers to form a conformal layer of a desired thickness. The processing chamber 100 may also be adapted for other deposition or substrate processing techniques. One example of a chamber that may be adapted to benefit from the invention is described in the previously incorporated U.S. patent application Ser. No. 10/032,284, which issued as U.S. Pat. No. 6,916,398 on Jul. 12, 2005.

The processing chamber 100 includes a chamber body 102 coupled to a gas panel 126 and pumping system 178. The gas panel 126 provides one or more process gases to the processing chamber 100. The pumping system 178 generally includes a vacuum pump and/or other flow controls for exhausting gases from the chamber body 102 and controlling the pressure therein.

The chamber body 102 is typically fabricated from aluminum or stainless steel. The chamber body 102 includes sidewalls 104 and a bottom 106. A substrate access port 108 is formed through the sidewalls 104 and provides access for a robot (not shown) to deliver and retrieve the substrate 110 from the processing chamber 100. A chamber lid assembly 132 is supported on the sidewalls 104 of the chamber body 102 and encloses a chamber volume 128.

The chamber lid assembly 132 is coupled to the gas panel 126 to provide gases, such as one or more process gases and/or a purge gas, to the interior of the processing chamber 100. The chamber lid assembly 132 typically includes a mixing box 172 coupled to a lid 170. The lid 170 may be made of stainless steel, aluminum, nickel-plated aluminum, nickel, or other suitable materials compatible with processing chemistries.

In the embodiment depicted in FIG. 1, a pumping channel 136 is formed in the lid 170. The pumping channel 136 is coupled to the pumping system 178 through an exhaust port 138 formed through the sidewalls 104 of the chamber body 102 to evacuate any desired gases from the processing chamber 100 and to help maintain a desired pressure or a desired pressure range inside the chamber volume 128 of the processing chamber 100.

In one embodiment, the mixing box 172 is fabricated from stainless steal and the lid 170 is fabricated from aluminum. The mixing box 172 includes gas inlets 136A, 136B formed therethrough to allow gas supplied from the gas panel 126 to enter an expanding channel 134 defined through the lid assembly 132.

In one embodiment, the expanding channel 134 begins in the mixing box 172 and flares outwardly to exit the lid assembly 132 through a bottom surface 160 of the lid 170 thereby allowing gases supplied from the gas panel 126 to enter the chamber volume 128 defined within the processing chamber 100. The expanding channel 134 is typically shaped as a truncated cone. Whether a gas is provided toward the walls of the expanding channel 134 or directly downward toward the substrate, the velocity of the gas flow decreases as the gas flow travels through the expanding channel 134 due to the expansion of the gas. The reduction of the velocity of the gas flow helps reduce the likelihood the gas flow will blow off reactants absorbed on the surface of the substrate 110 during processing.

A substrate support 112 supported above the bottom 106 of the chamber body 102 by a shaft 140. The substrate support 112 bifurcates the chamber volume 128 into a pumping region 166 and a processing region 164. The pumping region is defined below a support surface 142 of the substrate support 112. The processing region 164 is defined between the support surface 142 of the substrate support 112 and the bottom surface 160 of the lid 170.

The shaft 140 is coupled to a lift mechanism 114 that controls the elevation of the substrate support 112. The lift mechanism 114 typically raises the substrate support 112 and a substrate 110 disposed thereon to a processing position as shown in FIG. 1, and lowers the substrate support 112 to a position that facilitates substrate transfer. Bellows 124 provide flexible seals between the substrate support 112 and a lift plate 116 to allow motion without leakage or loss of vacuum from the chamber body 102.

The substrate support 112 includes a plurality of lift pins 120 disposed therethrough. The lift pins 120 may be selectively displaced by an actuator 118 that is coupled by a shaft 122 to the lift plate 116 disposed below the pins 120. The lift pins 120 are adapted to place the substrate 110 in a spaced-apart relation to the substrate support 112 to facilitate substrate transfer.

In one embodiment, the substrate support 112 includes an aluminum or ceramic body 130. The body 130 of the substrate support 112 is defined by the first or support surface 142 and an opposing second surface 144 that is coupled to the shaft 140. The support surface 142 is adapted to support the substrate thereon during processing. A flange 146 extends outward from the body 130 and is recessed below the support surface 142.

In one embodiment, a heating element 156 is coupled or embedded within the body 130 to control the temperature of the substrate support 112 and substrate 110 seated thereon. The heating element 156 may be a resistive heater, a conduct for flowing a heat transfer fluid or a thermoelectric device. The heating element 156 is coupled to a power source 158 and is adapted to maintain the substrate support 112 and substrate seated thereon at a predetermined temperature to facilitate substrate processing. In one embodiment, the substrate 110 is maintained between about 275 and about 300 degrees Celsius.

The substrate support 112 may include a vacuum chuck, an electrostatic chuck, or a clamp ring for securing the substrate 110 to the substrate support 112 during processing. In the embodiment depicted in FIG. 1, the support surface 142 of the substrate support 112 is coupled to a vacuum source 154 through the shaft 140 and body 130. The vacuum source 154 is adapted to apply a vacuum between the substrate 110 and support surface 142 of the body 130 to retain the substrate to the substrate support 112.

An edge ring 150 is disposed on the flange 146 of the substrate support 112. The edge ring 150 is typically comprised at least partially of aluminum, stainless steel, ceramic, or other material compatible with the processing environment. The edge ring 150 generally protects a portion of the substrate support 112 disposed outward of the substrate 110 from deposition or attack from process chemistries, and defines an annular channel 168 (shown in FIG. 3) with the substrate support 112 that directs purge gas, supplied from a purge gas source 152, to the perimeter of the substrate 110.

A seal 148 is disposed between the edge ring 150 and lid 170. The seal 148 generally separates the pumping region 166 from the processing region 164. The seal 148 is typically fabricated from a fluoropolymer or other material compatible with process chemistries suitable for use at elevated temperatures.

In order to ensure uniform flow of gases in the processing region 164, a plurality of gas flow control orifices (not shown in FIG. 1) are defined between the substrate support 112 and the lid assembly 132. The flow control orifices may be formed at least partially in the lid 170, edge ring 150, seal 148 or combinations thereof. The flow control orifices allow gas passage uniform and repeatable flow between the processing region 164 and the pumping region 166.

Figure 2:
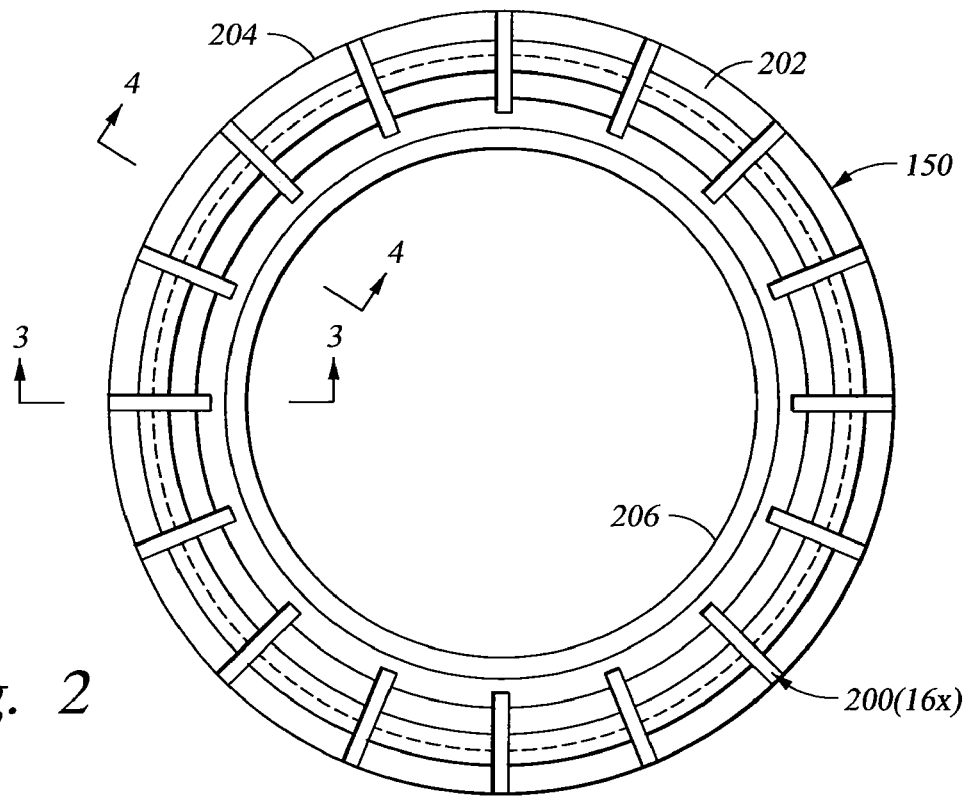
FIG. 2 is a top plan view of one embodiment of an edge ring.
Figure 3:
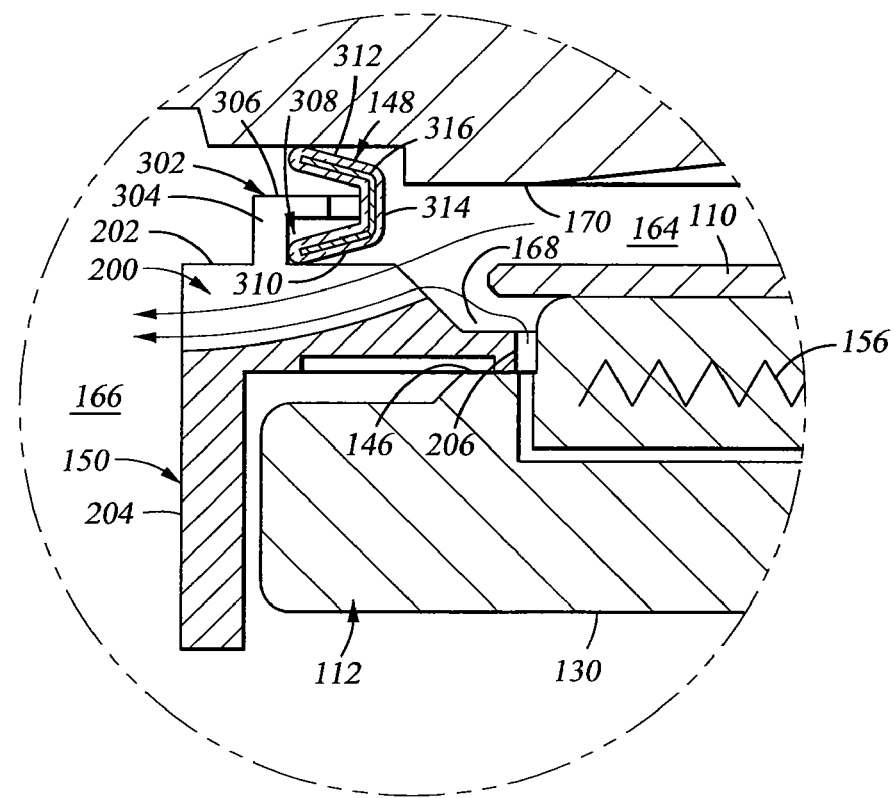
FIG. 3 is a partial cross-sectional view of the edge ring of FIG. 2 taken along section line 3-3.
Figure 4:
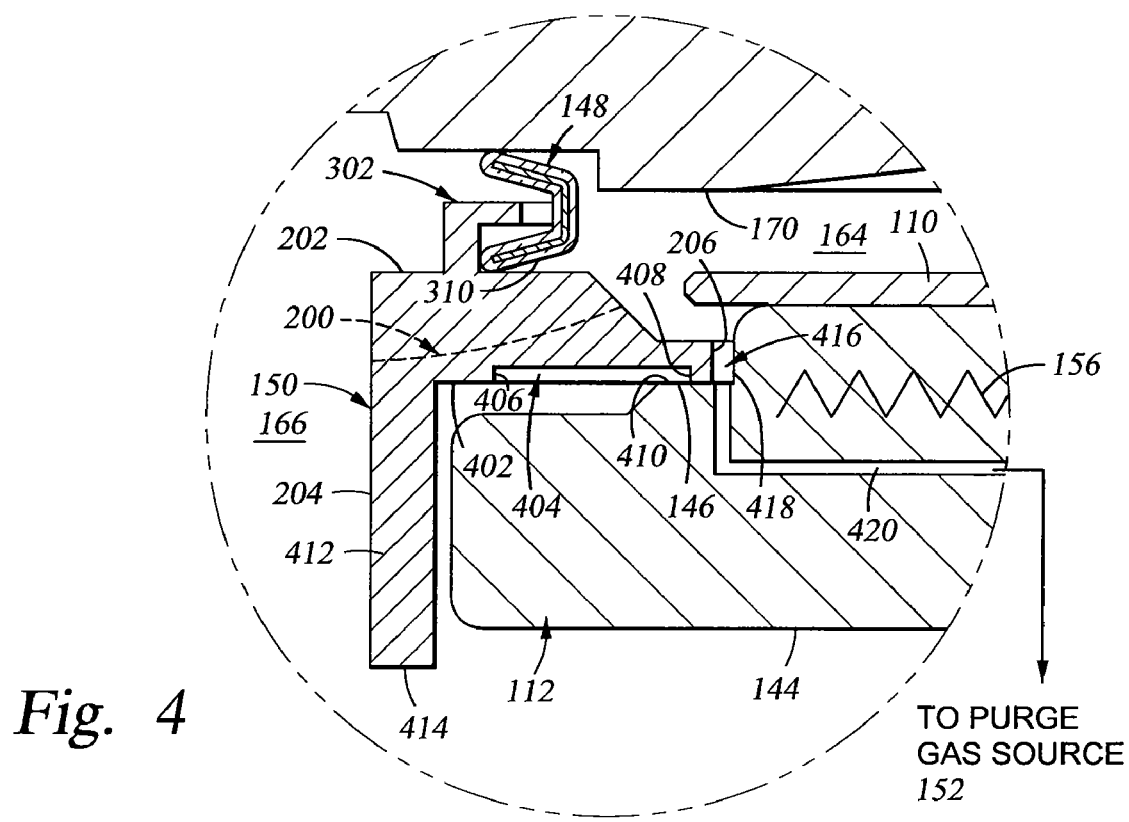
FIG. 4 is a partial cross-sectional view of the edge ring of FIG. 2 taken along section line 4-4.

FIGS. 2, 3 and 4 are a top view and partial sectional views of one embodiment of an edge ring 150 having a plurality of flow control orifices 200. The edge ring 150 has a top surface 202 disposed between an outer diameter 204 and an inner diameter 206. In the embodiment depicted in FIGS. 2, 3 and 4, the flow control orifices 200 are formed in the top surface 202 of the edge ring 150 and fluidly communicate with the outer diameter 204 of the edge ring 150 to allow gas to pass from the processing region 164 to the pumping region 166 during processing.

Referring to FIG. 3, the edge ring 150 includes a seal retaining feature 302 that is configured to retain the seal 148 to the edge ring 150. As the seal 148 may take different forms, for example, cup seals, lip seals, gaskets, o-rings and the like, the retaining feature 302 is generally configured to retain the particular type of seal 148 utilized. Alternatively, the seal retaining feature 302 may be formed in the lid 170.

In the embodiment depicted in FIG. 3, the seal retaining feature 302 is configured to capture a seal 148 having a "U" shaped cross section. The seal retaining feature 302 includes a first member 304 coupling the top surface 202 of the edge ring 150 to a second member 306. The second member 306 extends radially inward from the first member 304 to define a seal receiving pocket 308 with the top surface 202 of the edge ring 150.

A first flange 310 of the seal 148 is disposed in the seal receiving pocket 308. The first flange 310 is coupled by an annular wall 314 to a second flange 312. An optional spring form 316, typically fabricated from spring steel or stainless steel is embedded in the seal 148 to urge the first flange 310 away from the second flange 312. Thus, as the substrate support 112 is elevated toward the lid 170, the spring form 316 uniformly loads the flanges 310, 312 respectively against the edge ring 150 and lid 170 to provide a barrier to gas flow therebetween that accommodates minor variations in parallelism and spacing between the lid 170 and edge ring 150 to ensure a flow barrier that directs substantially all of the flow through the flow orifices 200, ensuring repeatable flow rates and uniformity during processing.

Referring to FIG. 4, the edge ring 150 is configured to minimize heat transfer between the substrate support 112 and edge ring 150. In the embodiment depicted in FIG. 4, a second surface 402 of the edge ring 150 includes an annular groove 404 that bifurcates the second surface 402 into an outer diameter portion 406 and an inner diameter portion 408. The edge ring 150 is configured so that only the inner diameter portion 408 of the edge ring 150 contacts an upper surface 410 of the flange 146. As the edge ring 150 and substrate support 112 have minimal contact, the edge ring 150 maintains a cooler temperature than the substrate support 112 during processing, thus extending the service life of the seal 148.

The edge ring 150 additionally includes an annular extension 412 that extends downward to an end 414 positioned below the second surface 402 of the edge ring 150. The extension 412 substantially covers the sides of the substrate support 112 thereby protecting the substrate support 112 from unwanted deposition or other contaminants during processing.

The extension 412 is configured to position the edge ring 150 on the substrate support 112 so that a small gap 416 is defined between the inner diameter 206 of the edge ring 150 and a wall 418 coupling the flange 146 and support surface 142 of the substrate support 112. The gap 416 allows purge gas, routed through a passage 420 formed through the substrate support 112 from the purge gas source 152, to flow between the edge ring 150 and the substrate 110 to minimized deposition of the edge ring 150 and substrate's edge.

Figure 5:
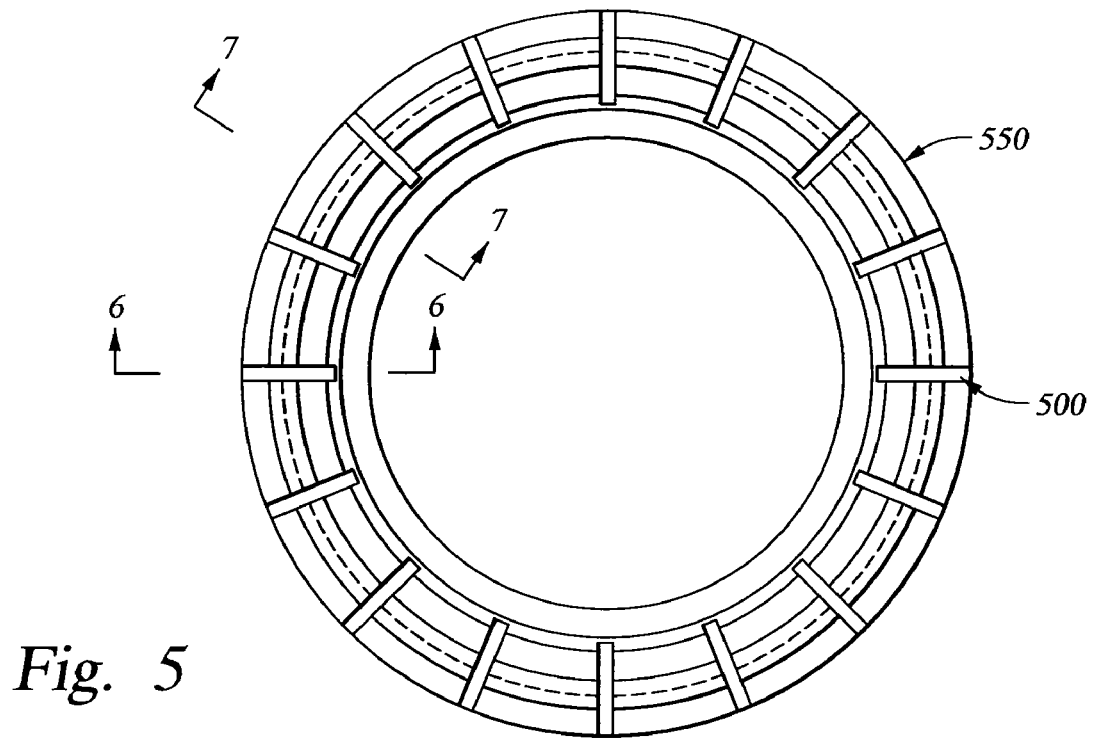
FIG. 5 is a top plan view of another embodiment of an edge ring.
Figure 6:
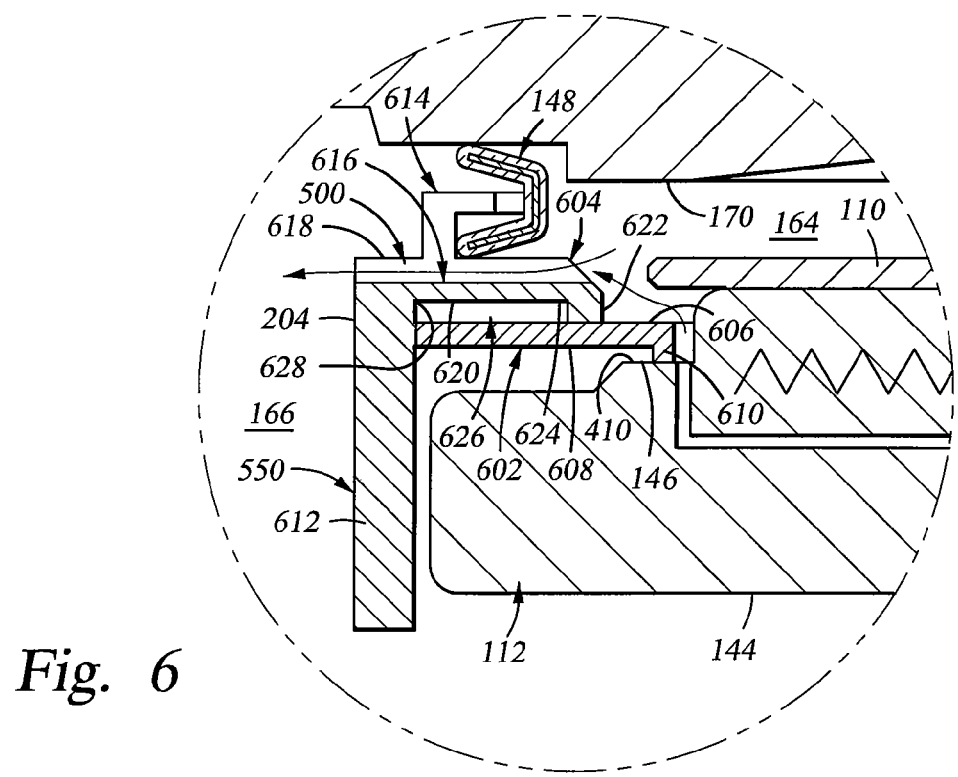
FIG. 6 is a partial cross-sectional view of the edge ring of FIG. 5 taken along section line 6-6 of FIG. 5.
Figure 7:
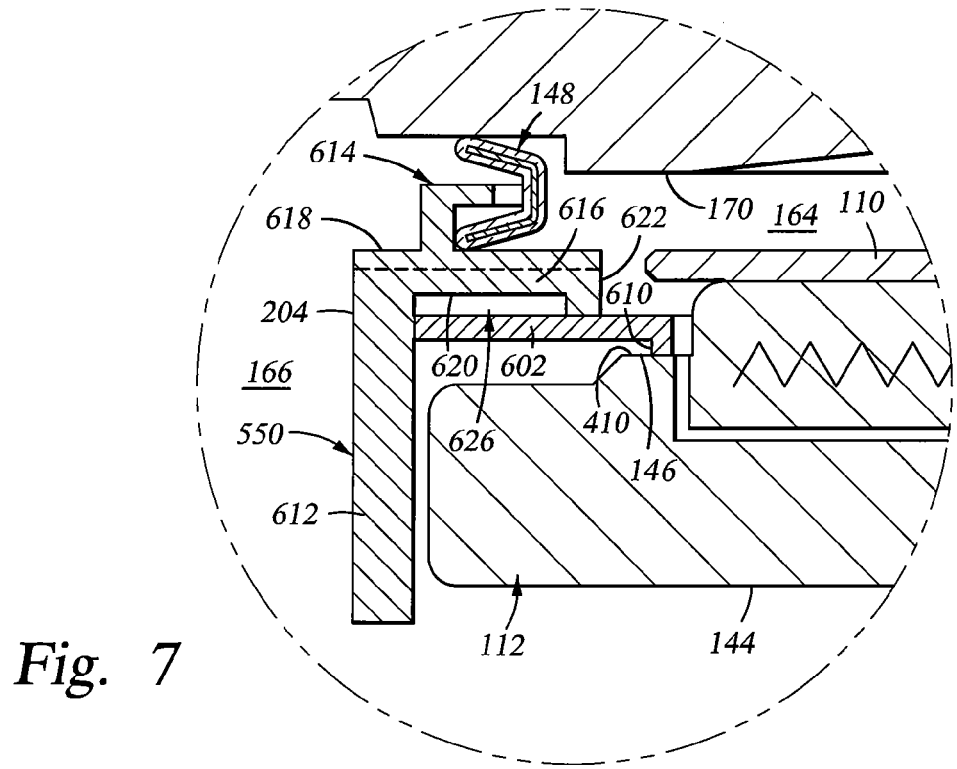
FIG. 7 is a partial cross-sectional view of the edge ring of FIG. 5 taken along section line 7-7 of FIG. 5.

FIGS. 5-7 are a top plan view and partial sectional views of another embodiment of a seal ring 550 having a plurality of flow control orifices 500. The flow control orifices 500 are radially formed in the seal ring 550 in a spaced-apart relation to enhance process gas flow uniformity over a substrate processed within the processing chamber 500. Referring to FIG. 6, the seal ring 550 typically includes a base 602 supporting a cover 604. The base 602 is typically fabricated from stainless steel to reduce heat flow between the edge ring 550 and the substrate support 112.

The base 602 is supported on the upper surface 410 of the flange 146 while the cover 604 retains the seal 148. The base 602 is typically an annular disk that includes a first surface 606 that supports the cover 604 and a second surface 608 that faces the substrate support 112.

The second surface 608 of the base 602 includes lip 610 that projects normally away from the second surface 608. The lip 610 contacts the upper surface 410 of the flange 146, thus maintaining the second surface 608 spaced-apart from the flange 146 to minimize thermal transfer between the edge ring 550 and the substrate support 112.

The cover 604 includes a seal retaining feature 614 to retain the seal 148 to the edge ring 550. The cover 604 is typically comprised of aluminum or other material having good heat transfer characteristics to draw heat away from the seal 148.

The cover 604 has an annular body 616 coupled to a flange 612. The body 616 is typically oriented parallel to the base 602. The body 616 has a first surface 618 and a second surface 620. The seal retaining feature 614 extends from the first surface 618. The seal retaining feature 614 is typically similar to the seal retaining feature 302 described above.

The flow control orifices 500 are formed in the first surface 606 of the cover 602. The flow control orifices 500 allow gas to pass under the seal 148 to provide gas flow between the processing and pumping regions 164, 166 of the processing chamber.

A lip 622 extends downwardly from an inner end 624 of the second surface 620. The lip 622 contacts the first surface 606 of the base 602. The lip 622 maintains the body 616 in a spaced-apart relation with the base 602, defining a gap 626 therebetween. The gap 626 and minimal contact area between the lip 622 and base 602 minimizes heat transfer between the base 602 and cover 604, thereby preventing the substrate support 112 from excessively heating the seal 148.

The flange 612 is typically coupled to the body 616 at an outer end 628 of the second surface 620. The flange 612 typically extends downward below the second surface 402 of the edge ring 550. The flange 612 substantially covers the sides of the substrate support 112, thereby protecting the substrate support 112 from unwanted deposition or other contaminants during processing.

Figure 8:
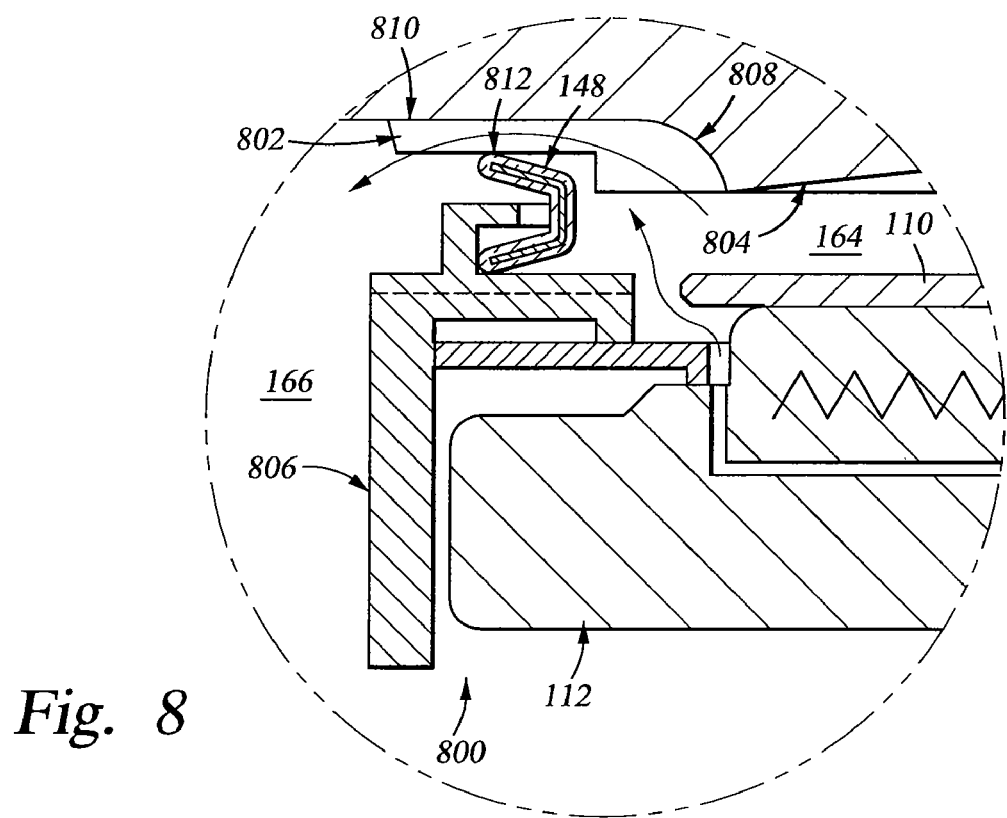
FIG. 8 is a partial sectional view of another embodiment of a processing chamber having a plurality of flow control orifices.

FIG. 8 is a partial sectional view of a processing chamber 800 having another embodiment of a plurality of flow restricting orifices 802 (one of which is shown in FIG. 8). The processing chamber 800 is typically similar to the processing chamber 100 described above, except that the flow restricting orifices 802 are formed in a lid 804 of the processing chamber 800.

A substrate support 112 is disposed in the processing chamber 800 and supports an edge ring 806 thereon. The edge ring 806 is similar to the edge rings described above, and may optionally include a plurality of second flow restricting orifices (not shown) similar to those shown in rings 150, 550. In the embodiment depicted in FIG. 8, the edge ring 806 does not permit gas flow therethrough.

A seal 148 is disposed between the lid 804 of the processing chamber 800 and the edge ring 806. The seal 148 is typically coupled to the edge ring 806 as shown in FIG. 8.

Figure 10:
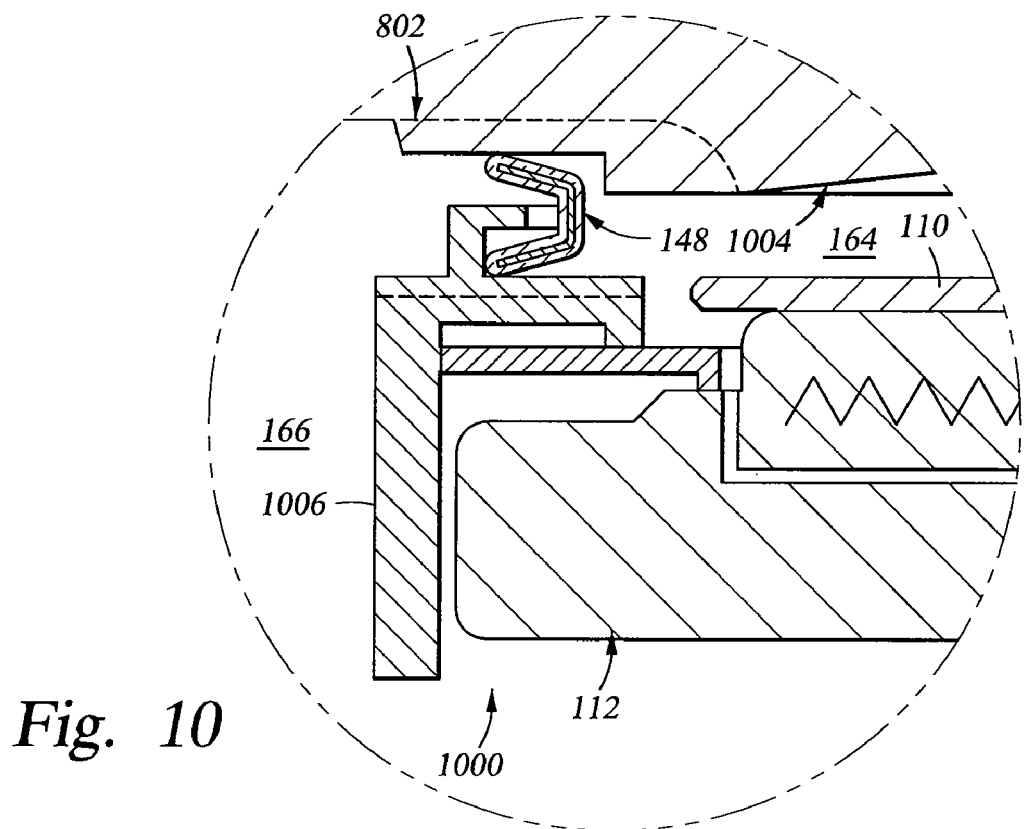
FIG. 10 is a partial cross-sectional view of an alternative embodiment of a lid having a seal retaining feature.

In another embodiment of a processing chamber 1000 having a plurality of flow restricting orifices 802 (one of which is shown in phantom in FIG. 10), the seal 148 is coupled a lid 1004 as shown in FIG. 10. The seal 148 provides a flow barrier between the lid 1004 and an edge ring 1006, thus forcing gas flowing between the processing region 164 and the pumping region 166 to pass through the restricting orifices 802 formed in the lid 1004.

Figure 9:
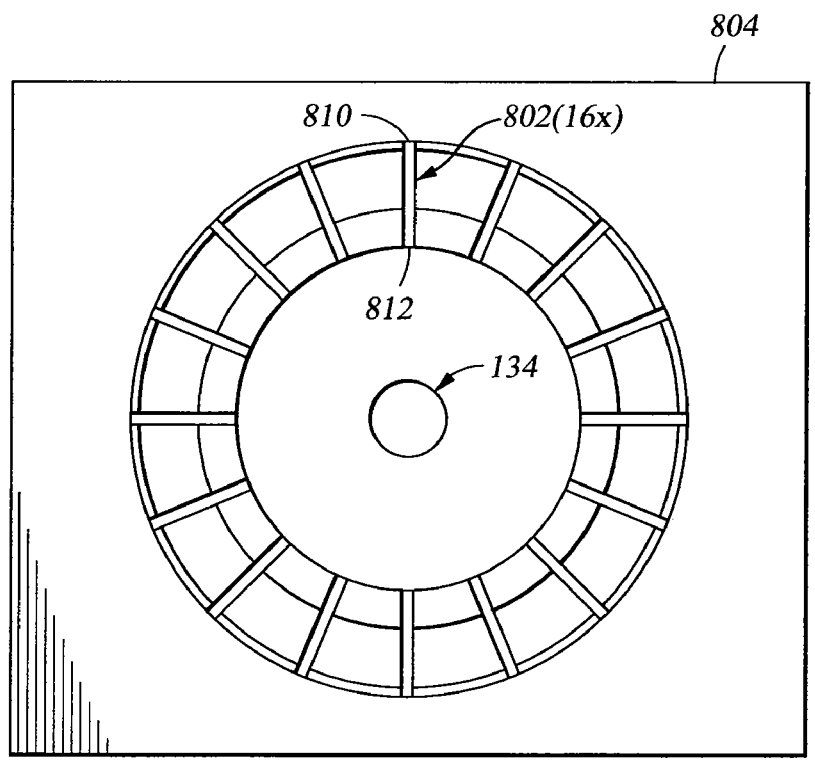
FIG. 9 is a bottom view of one embodiment of a chamber lid having flow control orifices.

Returning to the embodiment depicted in FIGS. 8 and 9, the plurality of flow restricting orifices 802 are radially oriented grooves or slots formed in the lid 804 in a spaced-apart relationship. The relative position between the flow restricting orifices 802 is typically defined to promote flow uniformity of process gases within the processing region 166. Each flow restricting orifice 802 has a first end 808 and a second end 810. The first end 808 is positioned radially inward of a point of contact 812 between the seal 148 and the lid 804. The second end 810 is positioned radially outwards of the point of contact 812, thus allowing gases confined in the processing region 164 by the seal 148 to flow to the pumping region 166. The flow restricting orifices 802 are configured to have a predefined sectional area so that a designed flow rate and pressure drop is achieved for a predetermined process regime. For example, in a processing chamber configured for ALD on 300 mm substrates, about 12-24 flow restricting orifices 802 are utilized having a combined sectional area of about 0.2 to about 0.4 square inches.

Figure 11:
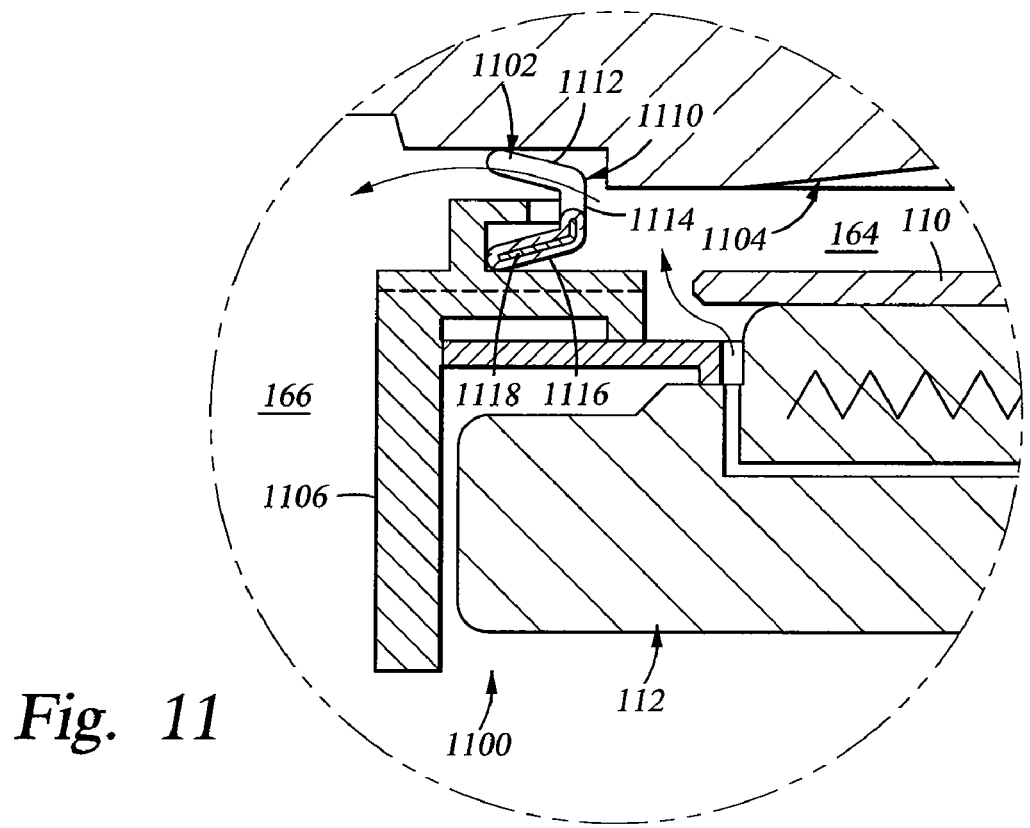
FIG. 11 is another embodiment of a processing chamber having flow control orifices.

FIG. 11 is a partial sectional view of a processing chamber 1100 having another embodiment of a plurality of flow restricting orifices 1102 (one of which is shown in FIG. 11). The processing chamber 1100 is typically similar to the processing chamber 100 described above, except that the flow restricting orifices 1102 are formed in a seal 1110 of the processing chamber 1100.

A substrate support 112 is disposed in the processing chamber 1100 and supports an edge ring 1106 thereon. The edge ring 1106 is similar to the edge rings described above, and may optionally include a plurality of second flow restricting orifices (not shown) similar to those shown in rings 150, 550. In the embodiment depicted in FIG. 11, the edge ring 1106 does not permit gas to flow therethrough.

A lid 1104 of the processing chamber 1100 is disposed above the substrate support 112. The lid 1104 is similar to the lids described above, and may optionally include a plurality of flow restricting orifices (not shown) as described with reference to the lid 804. In the embodiment depicted in FIG. 11, the lid 1104 does not permit gas flow therethrough.

The seal 1110 is disposed between the lid 1104 of the processing chamber 1100 and the edge ring 1106. The seal 1110 may be coupled to the edge ring 1106 as shown in FIG. 11 or coupled to the lid 1104.

Figure 12:
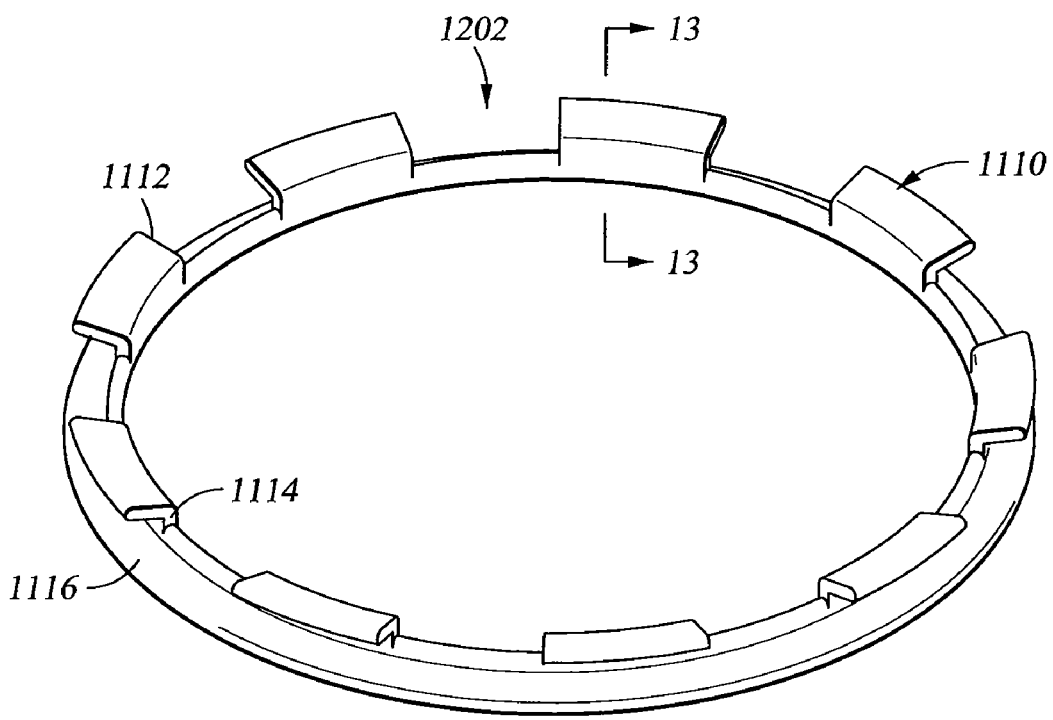
FIG. 12 is a perspective view of one embodiment of a seal.
Figure 13:
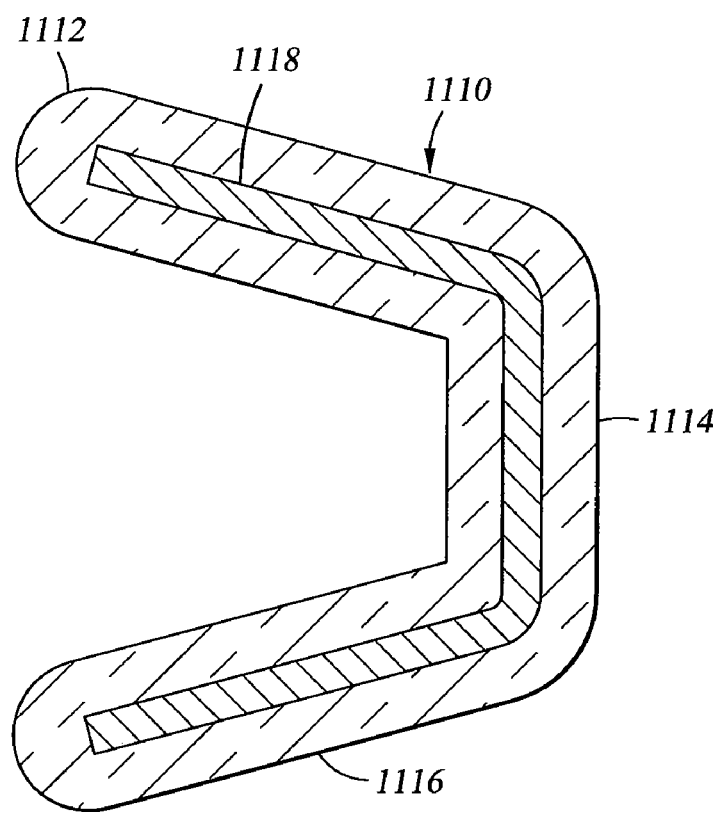
FIG. 13 is a sectional view of the seal of FIG. 12 taken along section lines 13-13.

Referring to FIGS. 11 and 12, the seal 1110 may be take different forms, for example, cup seals, lip seals, gaskets, o-rings and the like. In the embodiment depicted in FIG. 12, the seal 1110 is a cup seal similar to the seal 148.

The seal 1110 includes a first flange 1112 coupled by an annular wall 1114 to a second flange 1116. An optional spring form 1118 is embedded in the seal 1110 to urge the first flange 1112 away from the second flange 1116 to enhance sealing between the lid 1104 and the edge ring 1106.

The first flange 1112 and/or the wall 1114 include a plurality of slots 1202 formed therethrough that define the flow control orifices 1102. The slots 1202 allow gas to pass through the seal 1110 between the lid 1104 and edge ring 1106 to provide gas flow between the processing and pumping regions 164, 166 of the processing chamber.

In one exemplary deposition process, a tantalum nitride layer is deposited by ALD in the processing chamber 100 of FIGS. 1-4. The process provides pulses of pentadimethylamino-tantalum (PDMAT) from the gas panel 126 at a flow rate between about 100 sccm and about 1000 sccm for a pulse time of about 0.5 due to the small volume of the processing region 164. Pulses of ammonia may be provided from gas panel 126 at a flow rate between about 100 sccm and about 1000 sccm for a pulse time of about 0.5 seconds or less. An argon purge gas is provided continuously at a flow rate between about 100 sccm and about 1000 sccm from gas panel 126. The time between pulses of the tantalum containing compound and the nitrogen containing compound may be about 0.5 seconds or less. The substrate support temperature is typically maintained between about 200 degrees Celsius and about 300 degrees Celsius. A chamber pressure is maintained between about 1.0 and about 5.0 torr. The flow control orifices disposed between the substrate support 112 and lid 170 of the processing chamber 100 provide uniform gas flow across the substrate, enhancing deposition uniformity and process repeatability. This exemplary process provides a tantalum nitride layer in a thickness between about 0.5 Å and about 1.0 Å per cycle. The alternating sequence may be repeated until a desired thickness is achieved.

While the foregoing is directed to the preferred embodiment of the present invention, other and further embodiments of the invention may be devised without departing from the basic scope thereof, and the scope thereof is determined by the claims that follow.

The invention claimed is:

1. An edge ring for a substrate support, comprising:
   an annular body having an inner diameter and an outer diameter defining a top surface on a first side thereof and a bottom surface on a second side opposing the first side, wherein the bottom surface is configured to contact the substrate support at the inner diameter;
   an annular flange extending below the annular body at the outer diameter; and
   a seal retaining member having a first member extending from and projecting above the top surface of the annular body and a second member extending radially inward from the first member to define a seal receiving pocket.

2. The apparatus of claim 1, further comprising:
   an annular seal disposed in the seal receiving pocket of the seal retaining member.

3. The apparatus of claim 2, wherein the annular seal further comprises:
   a first flange coupled to a second flange by an annular center member; and
   a plurality of radial slots formed at least through the first flange.

4. The apparatus of claim 1, further comprising:
   a lip extending below the annular body at the inner diameter, the lip adapted to seat on the substrate support.

5. The apparatus of claim 1, wherein the bottom surface includes a base adapted to seat on the substrate support and the top surface further comprises:
   a cover having an annular seal retained therein.

6. The apparatus of claim 5, wherein the cover further comprises:
   an annular disk having a first surface and a second surface; and
   a lip extending from an inner side of the bottom surface to the disk, the lip adapted to maintain the disk and the base in a spaced-apart relation.

7. The apparatus of claim 5, wherein the base further comprises a lip projecting normally away from a bottom surface of the base.

8. The apparatus of claim 1, wherein the top surface further comprises:
   a plurality of flow control orifices formed therein, wherein at least a portion of the flow control orifices pass below the first member.

9. The apparatus of claim 1, wherein the retaining member is disposed between the inner diameter and the outer diameter.

10. An edge ring for a substrate support, comprising:
    an annular body having an inner diameter and an outer diameter defining a top surface on a first side thereof and a bottom surface on a second side opposing the first side, wherein the bottom surface is configured to contact the substrate support at the inner diameter;
    a seal retaining member extending from the top surface of the annular body; and
    an annular seal disposed in the seal retaining member, the seal retaining member and the seal extending above the top surface of the annular body.

11. The apparatus of claim 10, further comprising:
    a lip disposed on the inner diameter, the lip adapted to seat on the substrate support.

12. The apparatus of claim 10, wherein the top surface further comprises:
    a plurality of flow control orifices formed therein, wherein at least a portion of the flow control orifices pass below the seal retaining member.

13. The apparatus of claim 10, wherein the annular seal further comprises:
    a first flange coupled to a second flange by an annular center member.

14. The apparatus of claim 10, wherein the annular seal further comprises:
    a first flange coupled to a second flange by an annular center member; and
    a plurality of radial slots formed at least through the first flange.

15. A processing system, comprising:
    a chamber body;
    a lid disposed on the chamber body and defining an interior volume therewith;
    a substrate support disposed in the interior volume and at least partially defining a processing region with the lid;
    an edge ring comprising:
    an annular body having an inner diameter and an outer diameter defining a top surface on a first side thereof and a bottom surface on a second side opposing the first side, wherein the bottom surface is configured to contact the substrate support at the inner diameter;
    a seal retaining member extending from the top surface of the annular body; and
    an annular seal disposed in the seal retaining member, the seal retaining member and the seal extending above the top surface of the annular body;
    wherein a plurality of flow control orifices disposed between the substrate support and the lid, the flow control orifices adapted to control flow of gases exiting the processing region.

16. The processing system of claim 15, wherein the flow control orifices are radially aligned in a polar array.

17. The processing system of claim 15, wherein the flow control orifices are formed in the annular seal.

18. The processing system of claim 15, wherein the flow control orifices are formed in the edge ring.

19. The processing system of claim 15, wherein the flow control orifices are formed in the lid.

* * * * *